United States Patent [19]

Battochio

[11] 4,410,574
[45] Oct. 18, 1983

[54] PRINTED CIRCUIT BOARDS AND METHODS FOR MAKING SAME

[75] Inventor: George Battochio, Old Greenwich, Conn.

[73] Assignee: Xexex Industries, Inc., Norwalk, Conn.

[21] Appl. No.: 266,552

[22] Filed: May 22, 1981

[51] Int. Cl.³ .............................................. B32B 3/10
[52] U.S. Cl. ................................... 428/43; 174/68.5; 339/17 R; 361/412; 428/195; 428/901
[58] Field of Search ................ 428/43, 131, 901, 195; 427/96; 174/68.5; 361/412; 29/829, 831; 339/17 R

[56] References Cited

U.S. PATENT DOCUMENTS 4,072,771 2/1978 Grier .................................. 428/901
4,322,316 3/1982 Provance ........................... 428/901

FOREIGN PATENT DOCUMENTS 2912940 10/1980 Fed. Rep. of Germany ........ 428/43

Primary Examiner—Paul J. Thibodeau
Attorney, Agent, or Firm—Ladas & Parry

[57] ABSTRACT

A printed circuit panel is formed by providing at least one separable circuit board outline on an insulating base, each circuit board outline having at least one group of conductive strips within the outline, an output track extending from each of said groups of strips to a testing location on said base and an input track extending from an input location on said base to an input group of strips.

8 Claims, 4 Drawing Figures

PRINTED CIRCUIT BOARDS AND METHODS FOR MAKING SAME

BACKGROUND OF THE INVENTION a. Field of the Invention

This invention relates to the manufacture of printed circuit boards, and more particularly to providing a means for testing the circuits on such boards after manufacture.

b. Description of the Prior Art

Printed circuit boards are designed for use in electronic devices, and are intended to facilitate the manufacture of those devices.

A manufactured printed circuit board consists of an arrangement of conductive material placed upon an insulating base with holes therein. The conductive material is arranged to connect the holes in a predetermined pattern so that when electrical components are inserted into the holes, the conductive material connects the components in the pattern necessary to effect the purpose of the circuit. The conductive material acts as the wires of the desired circuit.

Since printed circuit boards, as generally used, are relatively small to permit their placement inside electrical devices (e.g. transistor radios, television sets), it is economical and preferred to manufacture a number of printed circuit boards as regions of a common panel to facilitate the handling and manufacture thereof. By way of example, a 5×7 matrix of circuit boards comprising 35 circuit boards of approximately 4 sq. in. could be made from one panel of 9"×18" during manufacture.

If there are a number of printed circuit boards made on one panel, it becomes necessary to remove the individual circuit boards from the rest of the panel so that they may be placed into their respective devices.

The general method of manufacturing printed circuit boards is well known and understood in the art. A problem, however, arises in the known methods of manufacture, in regard to testing. Because a number of circuit boards on a given panel may be unusable for various reasons after manufacture (e.g. failure of components, improper connections), it is necessary to test each circuit after it is fully constructed. This testing is conventionally done prior to the circuit boards being removed from the panel by engaging the panel with a test pin matrix connected to testing circuitry.

DETAILED DESCRIPTION OF THE PREFERRED EMBODIMENT

Figure 1:
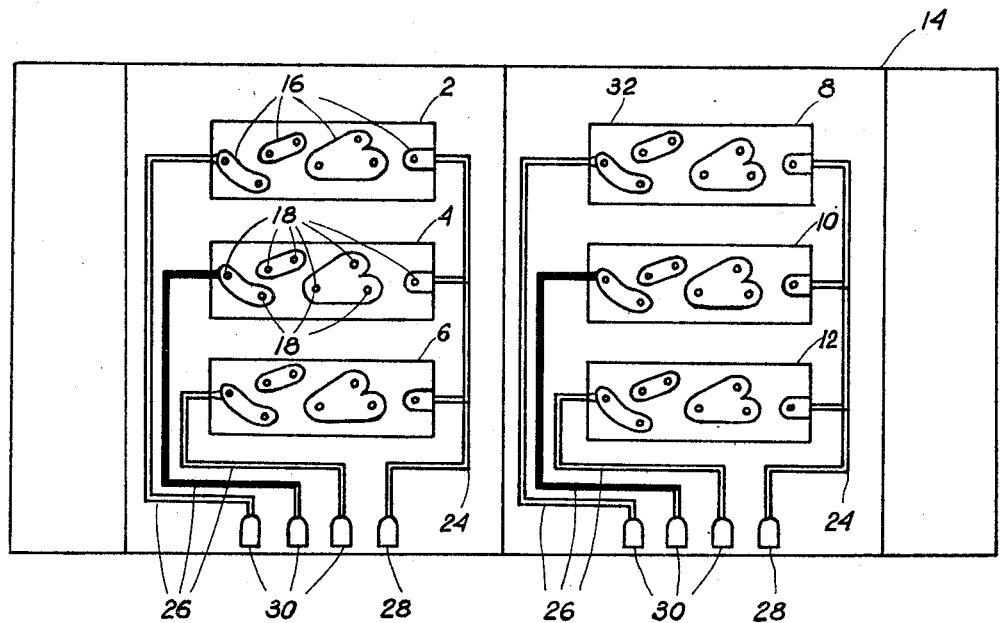
FIG. 1 illustrates a group of circuits placed upon one board, the board having several such groups placed thereon, only two of which groups are illustrated.
Figure 2:
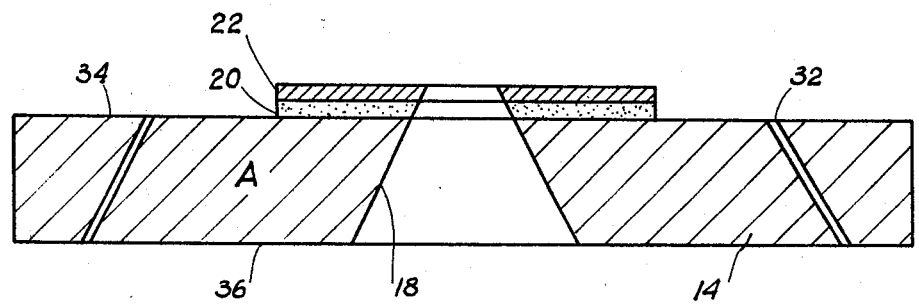
FIG. 2 illustrates a partial cross-section of a completed board.

FIG. 1 illustrates a plurality of printed circuit boards 2, 4, 6, 8, 10 and 12 forming a panel 14. Each circuit board includes a base member A of insulating material. An array of conductors 16, formed by strips of conductive material, is adhered to one side of the base member A, and electrical components (not shown), such as resistors, inductors and capacitors, are disposed at the other side of the base member. The leads of the components extend through holes 18 in the base member A and are then connected, at the conductor side of the base member, to the conductors.

The placement of the components and conductors is determined using conventional techniques.

However, a completed panel manufactured in accordance with this invention will carry more than simply the imprint of the several circuits. It will also carry a series of test tracks 24, 26 thereon. The test tracks each comprise a plurality of conductive strips of two kinds. The first kind of strip is a single strip 24 which connects the inputs of all of the circuits in a group of circuits to a common point 28.

The second kind of conductive strip 26 leads from the output of a single circuit to a point 30 at which the output of the circuit, when completed, may be tested. Preferably, the group of outputs corresponding to each group of circuits are placed in a single location, convenient for testing, e.g. near one edge of the board.

Once the desired pattern of conductive strips is established, a mask is produced and is used in the actual production of the printed circuit board. It comprises a representation of the conductive strips. The mask of one circuit therefore, represents both the wires which would run between the various components of the printed circuit if wires were used, and the test tracks. The components themselves are not represented in the mask but are connected at a later time.

Once the mask is prepared, the preparation of the actual printed circuit board begins.

First, a sturdy insulating material is chosen to act as the base of the board, upon which the conducting layers are placed. A suitable material might be either epoxy paper, or glass epoxy paper.

Once the board is chosen, and the mask is designed, there are several ways in which the circuit may be developed on the board, of which the preferred is the "subtractive" method.

According to this method, one entire surface of panel 14 is covered with a first conductive material, e.g. copper. The mask is used to deposit an etch-resist over the conductive material 20. The pattern of the resist layer conforms to the desired pattern of conductive material. Once this resist layer is deposited on the conducting material 20, the entire panel is subjected to etching with FeCl$_3$ which removes the untreated portions of the conductive material. Thus, only the conductive material 20 which corresponds to the desired pattern remains on the panel.

After the first conductive layer 20 is deposited on the panel 14, a second layer is deposited thereon. This second conductive layer 22 is preferably a tin-lead compound. This second conductive material is chosen so that solder will adhere thereto.

The second layer 22 may be applied to the side of the panel 14 on which the first conductive layer 20 remains by means of a general application thereto, as it will only adhere to the first conductive layer.

After this second conductive layer 22 is deposited on the panel, holes are made therein. The placement of the holes 18 correspond to the desired location of the leads of the components to be placed on the panel 14. These holes may be either stamped or drilled, although in the preferred embodiment, they are stamped. The holes 18 are made by placing a die member on the side of the panel 14 which has the circuit imprinted thereon, and a stamping element is placed on the opposite side of the panel 14. The stamping member then pushes through the panel, causing a hole to be created therein. Furthermore, the die member has an internal diameter which is greater than the external diameter of the stamping member. When the stamping member pushes through the panel 14, therefore, it creates holes which are of an increasing diameter, going toward the component side of the panel 14.

The differing diameter of the punched hole serves the valuable purpose of assisting in the final assembly of the circuit.

In the same process which creates the holes, the individual circuit boards are prepared for removal from the panel in any of several ways. The first preferred way is completely stamping out the circuit boards from the surrounding panel, by removing the board completely from the panel and then forcing it back into its original position during the same process, so that the discontinuity between the circuit and the remainder of the panel is quite small, and comprises the outline 32 of the board. It should be noted that the test tracks 24, 26 extend across the outline 32. The electrical discontinuity caused by the stamping procedure is cured by the soldering effected later as described below.

During the stamping process, virtually no material is removed, either from the panel or from the conductive material.

Furthermore, it is preferred that the stamped outline 32 of the circuit board be tapered in from the conductive layer side 34 of the panel to the opposite sides 36 thereof. This taper facilitates the replacement of the boards after stamping.

Figure 3:
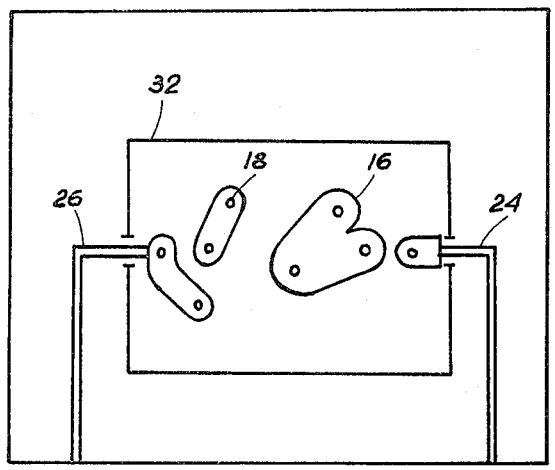
FIG. 3 illustrates a secondary embodiment of a circuit board manufactured in accordance with the invention.

A variation of this embodiment may be made by leaving small tab portions of the board intact. (See FIG. 3) The test tracks will then run over the tab, at least in part.

Figure 4:
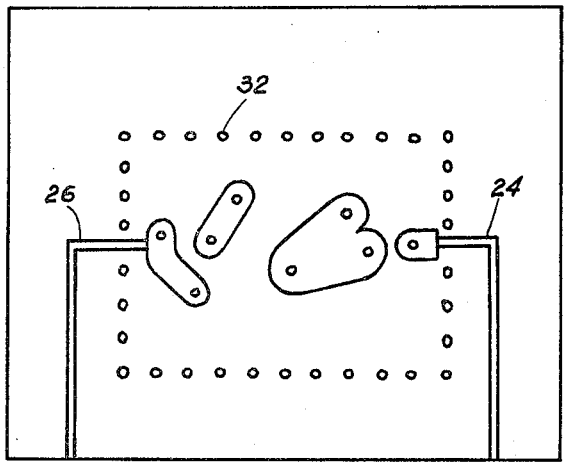
FIG. 4 illustrates a tertiary embodiment thereof.

Another embodiment (FIG. 4) may be made by perforating the outline of the board rather than completely stamping it out. In this embodiment, the test track would be of sufficient width that it would bridge, at least in part, the spaces between the perforations.

Once the stamping is performed the components may be attached thereto.

The components are attached to the side of the panel opposite the conductive layers in any of a number of conventional fashions so that the leads of the components extend through the panel to the conductor side thereof, where they are soldered in place. The solder acts as a connector between the components and the conductive member 16 of the panel.

The preferred method of soldering the leads of the components to the conductive layers is by the so-called "wave-solder" technique, for example using the UL-TRAPEK Lambda Wavesolder System manufactured by Electrovert. In this technique, the panel is moved over a wave of solder with the component side up, and, therefore, the conductive layer side down. Solder is applied to the entire conductive layer side 34, but the solder will only adhere to the leads which project through the base member 7, and the conductive portions. In the first above-described embodiment, the taper of the stamp-out of the individual circuits boards assists in preventing the circuits from falling into the solder.

Once the components are soldered in place, it is possible to test the circuits, by applying a common input to the common input test track 28, and testing the individual output test tracks 30 for the expected results. If the circuits do not perform as expected it is easy to remove them. Therefore, only the circuits which perform properly are retained and the remainder are disposed of. In this fashion, a greater reliability and ease in testing is achieved.

I claim:
1. A printed circuit panel comprising:
  a: a solid insulating base, with at least one separable circuit board outline defined therein;
  b: at least one group of strips of conducting material each of which group is located within one of said circuit board outlines;
  c: an output track extending from each said group of strips, across said circuit board outline, to a testing location on said base; and
  d: an input track extending from an input location on said base to an input of a group of strips, whereby said output track and said input track enable each separable board outline to be tested as a group.

2. A printed circuit panel according to claim 1 wherein:
  said base has a plurality of circuit board outlines therein, arranged in at least one group.

3. A printed circuit panel according to claim 1 or 2, wherein:
  each said circuit board outline extends completely around the periphery of a group of conductive strips.

4. A printed circuit panel according to claim 3 wherein:
  said circuit board outline tapers in from the side of the base on which are the conductive strips, to the other side thereof.

5. A printed circuit panel according to claim 1 or 2, wherein:
  said circuit board outline extends only partially around said group of strips, and said group of strips is retained in continuous contact with said panel by means of a tab portion.

6. A printed circuit panel according to claim 5, wherein:
  a portion of at least one of said output track and said input track lies on said tab portion.

7. A printed circuit panel according to claim 1 or 2, wherein:
  said circuit board outline comprises a series of perforations.

8. A printed circuit panel according to claim 7, wherein:
  a portion of at least one of said output track and said input track lies between two of said perforations.

* * * * *